(12) United States Patent
Hsu et al.

(10) Patent No.: US 7,525,170 B2
(45) Date of Patent: Apr. 28, 2009

(54) PILLAR P-I-N SEMICONDUCTOR DIODES

(75) Inventors: Louis Lu-Chen Hsu, Fishkill, NY (US); Jack A. Mandelman, Flat Rock, NC (US); Kangguo Cheng, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/538,557

(22) Filed: Oct. 4, 2006

(65) Prior Publication Data

US 2008/0083963 A1    Apr. 10, 2008

(51) Int. Cl.
*H01L 31/058* (2006.01)

(52) U.S. Cl. .................. 257/458; 257/46; 257/367; 257/601; 257/656; 257/655

(58) Field of Classification Search ........... 257/46, 257/367, 601, 656, 655, 458, E33.046, E29.336, 257/E31.036, E31.087–E31.088, E31.061–E31.062
See application file for complete search history.

(56) References Cited

U.S. PATENT DOCUMENTS

| | | | |
|---|---|---|---|
| 4,827,114 A * | 5/1989 | Uchida et al. ............ | 250/214.1 |
| 5,055,894 A * | 10/1991 | Chan ........................ | 257/85 |
| 6,111,305 A | 8/2000 | Yoshida et al. | |
| 6,177,289 B1 | 1/2001 | Crow et al. | |
| 6,300,648 B1 * | 10/2001 | Mei et al. ................. | 257/59 |
| 6,451,702 B1 | 9/2002 | Yang et al. | |
| 6,538,299 B1 | 3/2003 | Kwark et al. | |
| 6,707,126 B2 | 3/2004 | Iriguchi | |

OTHER PUBLICATIONS

Min Yang et al., "High Speed Silicon Lateral Trench Detector on SOI Substrate", IEEE, 2001, pp. 24.1.1-24.1.4.
Min Yang et al., "A High-Speed, High-Sensitivity Silicon Lateral Trench Photodetector", IEEE Electron Device Letters, vol. 23, No. 7, Jul. 2002, pp. 395-397.

* cited by examiner

*Primary Examiner*—N Drew Richards
*Assistant Examiner*—Swapneel Chhaya
(74) *Attorney, Agent, or Firm*—H. Daniel Schnurmann

(57) ABSTRACT

An arrangement of pillar shaped p-i-n diodes having a high aspect ration are formed on a semiconductor substrate. Each device is formed by an intrinsic or lightly doped region (i-region) positioned between a P+ region and an N+ region at each end of the pillar. The arrangement of pillar p-i-n diodes is embedded in an optical transparent medium. For a given surface area, more light energy is absorbed by the pillar arrangement of p-i-n diodes than by conventional planar p-i-n diodes. The pillar p-i-n diodes are preferably configured in an array formation to enable photons reflected from one pillar p-i-n diode to be captured and absorbed by another p-i-n diode adjacent to the first one, thereby optimizing the efficiency of energy conversion.

14 Claims, 12 Drawing Sheets

PILLAR P-I-N SEMICONDUCTOR DIODES

FIELD OF THE INVENTION

The present invention relates generally to semiconductor devices, and more particularly, to integrated semiconductor pillar p-i-n diodes.

RELATED ART

Photodetectors are widely used as optical sensors, optical receivers, and photo couplers in a variety of applications, such as optical interconnections, fiber optic communications, integrated photoelectronics, and the like.

Silicon-based photo detectors, such as p-i-n diodes are attractive for fabricating low cost photo detectors in high volumes, in simple packages with other circuits integrated on the same substrate. Typically, a p-i-n diode consists of an intrinsic (i) or lightly doped semiconductor region positioned between a p-type region and an n-type region. Electron-hole pairs are generated within the diode when a high intensity light signal shines on the depleted intrinsic region. When the photodiode is reverse biased, i.e., the n-region is at a higher voltage potential than the p-region, then, electrons are swept toward the n-region while holes move toward the p-region, allowing a current to flow through the device. When the light signal disappears, the current generated by the photodiode ceases.

P-i-n diodes are advantageously used either individually for detecting imaging pixels or in an array configuration that combines signals in response to an optical beam of data. As such, photo-detectors have made significant inroads in the field of photo imaging and optical data transmission systems. Another application for p-i-n diodes is using it as a variable resistor at radio frequencies (RF) and microwave frequencies. The resistance of the p-i-n diode is determined only by the forward biased DC current. Such devices control the RF signal level without introducing distortion for switching and attenuating applications. Another significant advantage of p-i-n diodes resides in their ability of controlling large RF signals while using smaller levels of DC excitation.

Various aspects of p-i-n diodes have been described in the prior art. Related patents and publications are:

U.S. Pat. No. 6,111,305 to Yoshida describes a p-i-n photodiode having an i-type semiconductor region with a thickness no greater than the width of the depletion region depending on the concentration of impurities in the i-type semiconductor region, wherein the depletion electrode is attached to ground or to a fixed voltage. Further, the depletion electrode is arranged in a pattern of stripes, concentric annuli, or antennae.

U.S. Pat. No. 6,707,126 to Iriguchi describes a p-i-n photodiode for converting light into photocurrent in response to light, and a transistor integrated with the photodiode through which the photocurrent is outputted. The p-i-n photodiode is arranged horizontally in the semiconductor layer.

U.S. Pat. No. 6,177,289 of Crow et al. describes an optical semiconductor detector on semiconductor substrate having a plurality of trenches etched therein. The trenches are formed as a plurality of alternating n-type and p-type trench regions separated from each other on the substrate. Contacts connect respectively the n-type regions and the p-type regions.

U.S. Pat. No. 6,451,702 to Yang et al. describes a method of constructing lateral trench p-i-n photodiodes, where trenches patterned and etched in the substrate are formed alongside other electrode types simultaneously.

U.S. Pat. No. 6,538,299 to Kwark et al. describes a trench silicon-on-insulator (SOI) formed on a substrate in which an isolation trench surrounds alternating p-type and n-type trenches, and electrically isolates the device from the substrate.

Publications regarding p-i-n photodiodes include M. Yang et al. "A High-Speed, High-Sensitivity Silicon Lateral Trench Photodetector," IEEE Electron Device Letters, Vol. 23, pp. 395-397 (2002); and M. Yang et al. "High Speed Silicon Lateral Trench Detector on SOI Substrate," IEDM, pp. 547-550 (2001).

In the prior, the shape and construction of the devices are characterized by a low absorption coefficient of the silicon which limits the sensitivity and/or the response of the silicon p-i-n diodes. The majority of the photons that impinge the planar surface of the device are reflected and lost. The remaining photons cannot penetrate deeper into the device since the material of a single crystal semiconductor is mostly opaque to photons. The response can be improved by increasing the sensing area of the light signal, however, this approach adversely impacts the area density of the device.

Therefore, there is a need in industry for a highly responsive and high density p-i-n diode array and for finding corresponding methods of fabrication that can easily be integrated in a CMOS manufacturing line.

OBJECTS AND SUMMARY OF THE INVENTION

Accordingly, it is an object of the invention to provide a p-i-n diode and/or a plurality thereof formed in a single crystal, each p-i-n diode shaped as a high aspect ratio pillar, spike or column.

It is another object to construct an array of high aspect ratio p-i-n diodes, such that light energy impacting the surface of one device, when reflected, bounces to a second device in close proximity to the first, and after one or several reflections is finally absorbed by one of the p-i-n diodes of the array.

It is still a further object to increase the efficiency of light absorption by placing the p-i-n devices forming the array in close proximity of one another by increasing the density and optimizing the absorption of light energy (i.e., photons) by the p-i-n devices forming the array.

It is yet another object to cap the array of p-i-n diodes with an optically transparent dielectric to improve reliability.

These and other objects of the invention are achieved by providing a novel p-i-n diode and a plurality thereof configured in an array formation, each device displaying a high response per unit area (of the substrate). Each p-i-n diode is formed in the shape of a silicon pillar, spike or column, which includes an intrinsic or lightly doped region (i-region) positioned between a P+ region and an N+ region at respective ends of the pillar.

In a first aspect of the of a preferred embodiment of the invention, for a given surface area, more light energy is absorbed by pillar p-i-n diodes than by conventional planar p-i-n diodes when n>2 and m>1.27, where n and m are parameters that define the physical features of the pin diode array with respect to basic geometric attributes. In the present instance, m defines the height (h) of the pillar relative to the radius (r) at the bottom of the pillar; and n relates to the pillar center-to-center spacing (d) to the radius (r) at the bottom of the pillar. By way of example, the sensitivity of p-i-n diodes formed on silicon pillars having an aspect ratio (the ratio between the height of pillar to the diameter of the pillar, or m/2) of about 5 (m=10), which greatly improves its performance.

In a second aspect of a preferred embodiment of the invention, there is provided a semiconductor device on a substrate that includes: a columnar shaped p-i-n diode, the diode having, preferably, an upper p-doped region, a middle i-region and a lower n-doped region. The p-i-n diodes are advantageously configured in a highly dense matrix formation immersed in an optically transparent medium to improve the reliability of the structure in order to maximize the number of photons impinging the array being absorbed by the p-i-n devices.

In a third aspect of a preferred embodiment of the invention, there is provided a method of fabricating pillar shaped p-i-n diodes on a substrate, including the steps of: a) growing an N+ doped layer on the substrate; b) growing an intrinsic layer on the N+ layer; c) growing a P+ doped layer on the intrinsic layer; and d) selectively etching the layers into p-i-n pillars.

BRIEF DESCRIPTION OF THE DRAWINGS

The accompanying drawings, which are incorporated in and which constitute part of the specification, illustrate preferred embodiments of the invention which, together with the general description given above and the detailed description of the embodiments described below serve to explain the principles of the invention.

DETAILED DESCRIPTION OF PREFERRED EMBODIMENTS

In a preferred embodiment of the present invention, a sea-of-pin diodes, preferably configured in an array formation, is described. Preferably, the aspect ratio of each diode forming the array is greater than eight to minimize the probability of photons escaping the surface of the sea-of-pin diodes. To further optimize this effect, the surface covered with silicon p-i-n spikes is dark, since no light is reflected back. The underlying concept of the preferred embodiment of the invention is to trade surface area of the pin diode with cross-sectional area. It is conceivable that by maximizing the surface area of the p-i-n devices, the better chance for photons to be absorbed by the p-i-n device. Consequently, after several bounces, the photons end by being absorbed by one or some other diode.

A distinct advantage of an upright p-i-n diode resides in the surface area of the intrinsic (i) region not only being enlarged but also having it exposed to photons. Electron-hole pairs generated within the intrinsic region are separated by drift forces induced by an electric field. The carriers separated by drift force move much faster than those created within the N or P regions and separated by diffusion. On the other hand, the cross-sectional area is reduced when compared to that of a planar p-i-n device. A smaller cross-sectional area contributes to a higher carrier resistance; however, since millions of such pins diodes are connected in parallel, the overall cross-sectional area and, thus, the carrier resistance become acceptable.

Figure 1A:
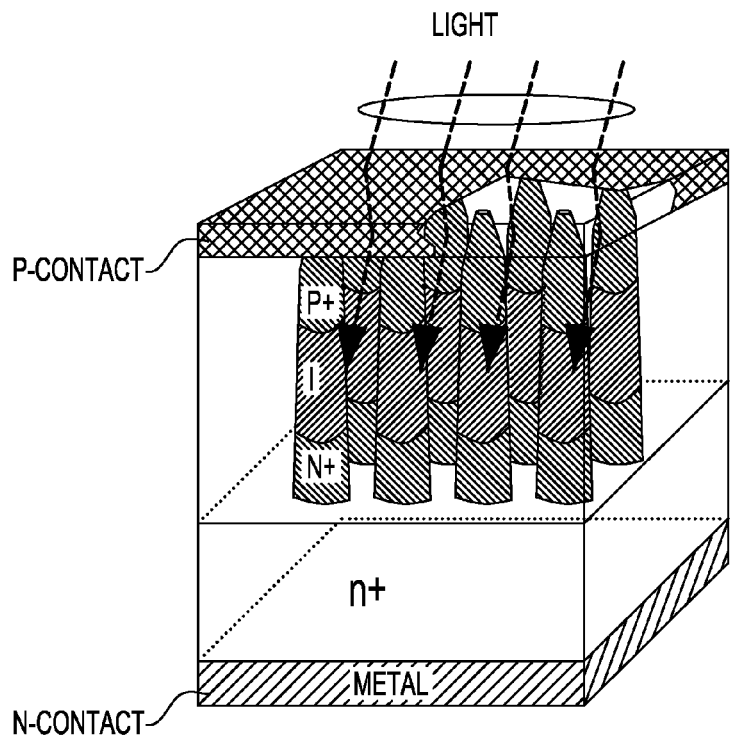
FIG. 1A is a schematic diagram showing a three-dimensional (3D) perspective view of an array of upright p-i-n diodes, according to an embodiment of the invention.

Referring to FIG. 1A, there is shown a plurality of upright p-i-n diodes in accordance with an embodiment of the present invention. Each diode includes an upper P+ doped region, a middle intrinsic region (i) and a lower N+ doped region, the lower N+ region being attached to an N+ doped substrate. An upper transparent electrode and a lower metallic electrode are provided to form a conductive contact to the diodes. Light is preferably projected from the top surface of the p-i-n diodes transmitting through the upper electrode and casting on the sidewall surfaces of each diode.

Figure 1B:
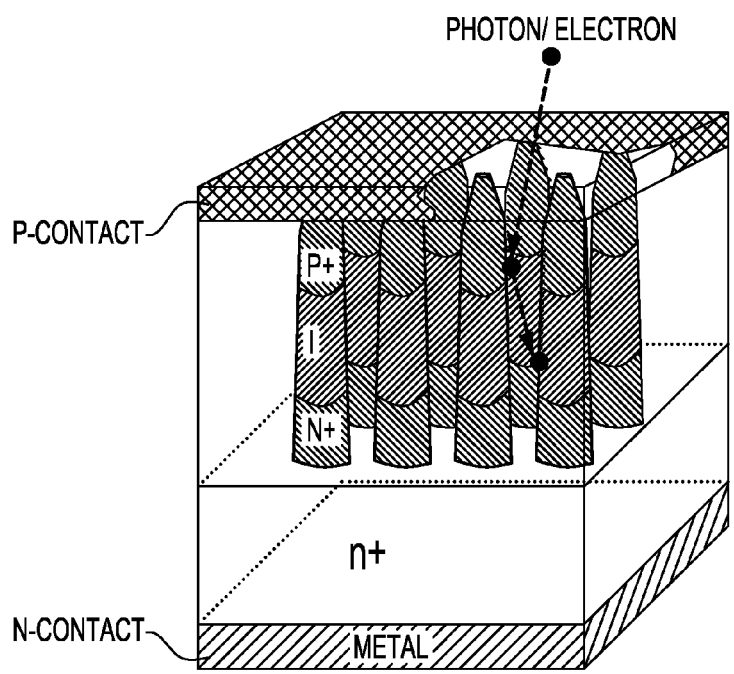
FIG. 1B is a schematic diagram showing a 3D perspective view of the array of p-i-n diodes, wherein a photon bouncing from one device is absorbed by an adjacent device after bouncing once or several times.

Referring to FIG. 1B, a photon is shown impinging on a first p-i-n device being reflected on its surface and bouncing to a second device in the vicinity of the first. It is understood that photons may be reflected once or several times on some other device but, eventually they will find a home on some p-i-n diode after bouncing between adjoining devices.

Figure 2:
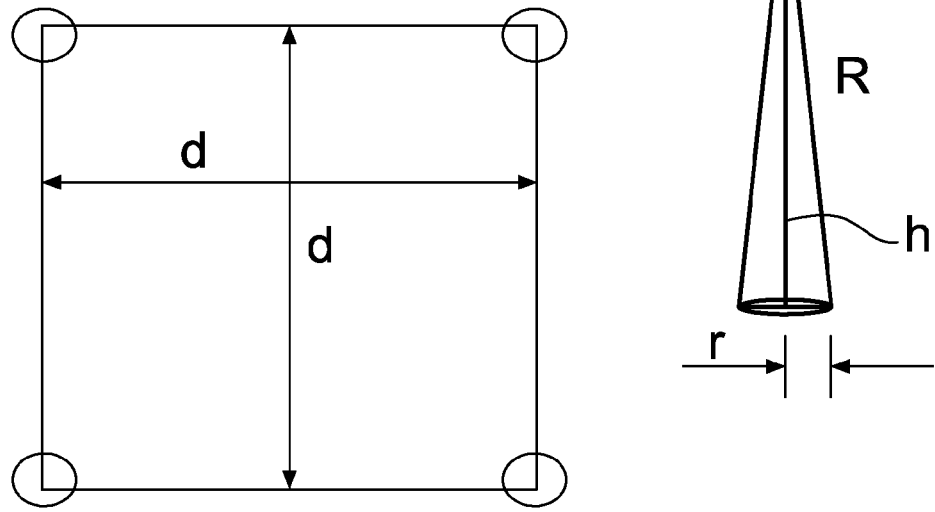
FIG. 2 shows a diagram for estimating the area efficiency applicable to the p-i-n diodes of the present invention.

Referring to FIG. 2, a rough estimation illustrates how upright p-i-n diodes, characterized by having significant improved area efficiency, compare to conventional planar diodes. Assuming that the distance between two adjacent diodes is "d", the radius of each diode is "r", and the height of the spike is "h". Two coefficients n and m represent the ratio of d/r and the ratio h/r, respectively. The area efficiency (AE), defined as the surface area ratio of the p-i-n diode to the planar diode, in this case is $m\pi/n^2$. Therefore, if n=2, and m=10, then the AE=7.58.

A first embodiment of the fabrication steps to manufacture p-i-n diodes is described in FIGS. 3A-3G in which like numerals represent the same or similar elements.

Figure 3A:
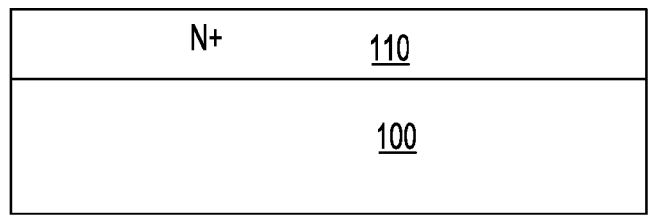
FIGS. 3A-3G show a first set of schematic diagrams illustrating a first embodiment of the invention.

Referring to FIG. 3A, a semiconductor substrate 100 preferably made of silicon is provided. An N+ layer 110 is formed on a surface of the substrate. The N+ layer 110 contains N-type dopants such as phosphorus, arsenic, antimony, sulfur, selenium, and the like. The process of forming the N+ layer includes but is not limited to ion implantation, plasma doping, plasma immersion ion implantation, infusion doping, gas phase doping, in-situ doped epitaxial growth, solid phase doping (by depositing a dopant source layer such as arsenic-doped oxide, driving dopants into the substrate by high-temperature anneal, and removing the dopant source layer), and any combination thereof. Alternatively, the entire substrate is doped.

Figure 3B:
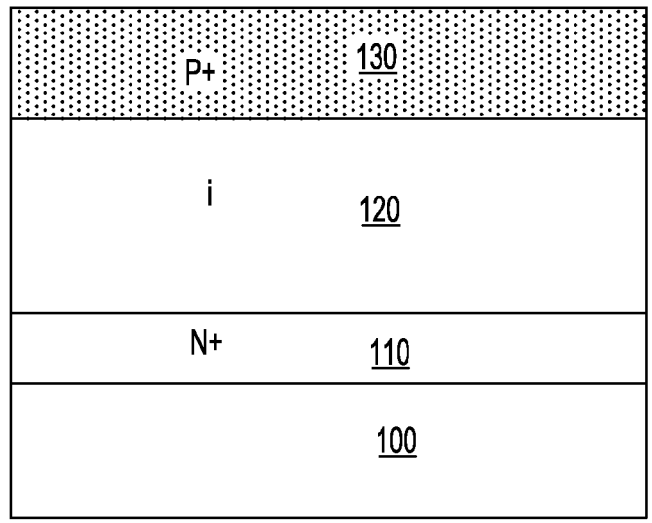

Referring to FIG. 3B, an intrinsic or lightly doped layer (i-layer) 120 is epitaxially grown on the N+ layer 110. A P+ layer 130 is then formed on the i-layer 120. The P+ layer 130 is formed using similar techniques for forming the N+ layer, as described above, except that p-type dopants such as boron, gallium, and/or indium are used. When in-situ doped epitaxial growth is used, the P+ layer may be grown in the same chamber after growing the i-layer.

Figure 3C:
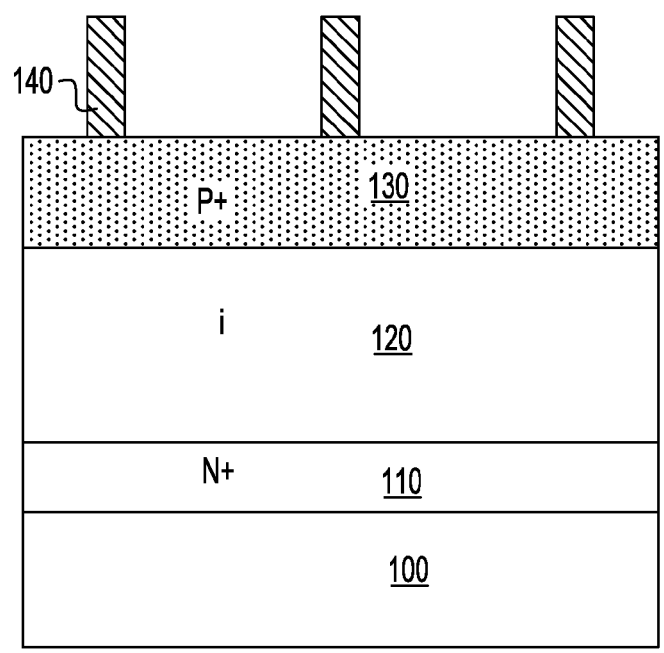
Figure 3D:
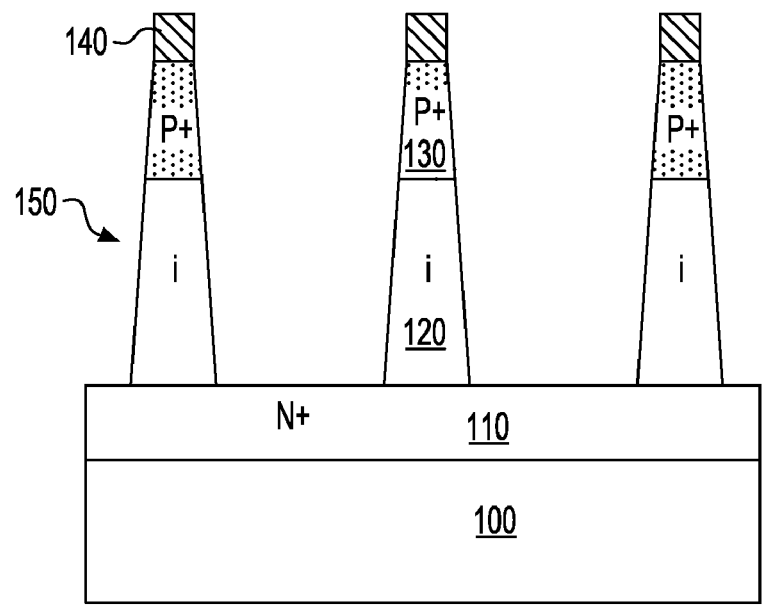

Referring to FIG. 3C, a hardmask layer 140 is formed atop the P+ layer 130. The hardmask layer 140 is preferably made of silicon nitride, although other suitable materials may be used. Optionally, an underlying oxide layer (not shown) is formed before the nitride. The hardmask layer 140 is patterned by conventional lithography followed by an etch process such as RIE. The pattern is then transferred to the substrate by RIE to form silicon pillars 150 through the P+ layer 130 and i-layer 120, as shown in FIG. 3D. Preferably, the pillars 150 have a tapered profile, i.e., the dimension of the pillars is smaller at the top than at the bottom. Preferably, the top dimension of the pillars is about 50-200 nm whereas the bottom dimension is 1.2 to twice the top dimension. The aspect ratio, (the ratio between the heights of the pillars to the bottom diameter of the pillars), ranges from 2 to 100. An aspect ratio ranging from 5 to 50 and more preferably, from 10 to 20 are used.

Figure 3E:
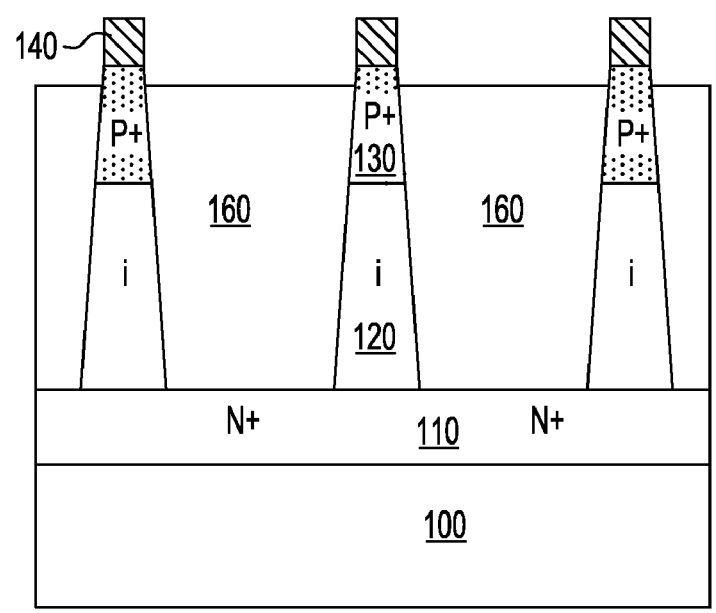

Referring to FIG. 3E, gaps between pillars are filled with an insulator 160, e.g., silicon oxide. Processes for gap filling include, but are not limited to, chemical vapor deposition (CVD), high density plasma CVD (HDPCVD), low pressure CVD (LPCVD), plasma enhanced CVD (PECVD), atomic layer deposition (ALD), spin-on-glass, and any suitable combination of the above. The oxide is then recessed to expose part of the P+ layers.

Figure 3F:
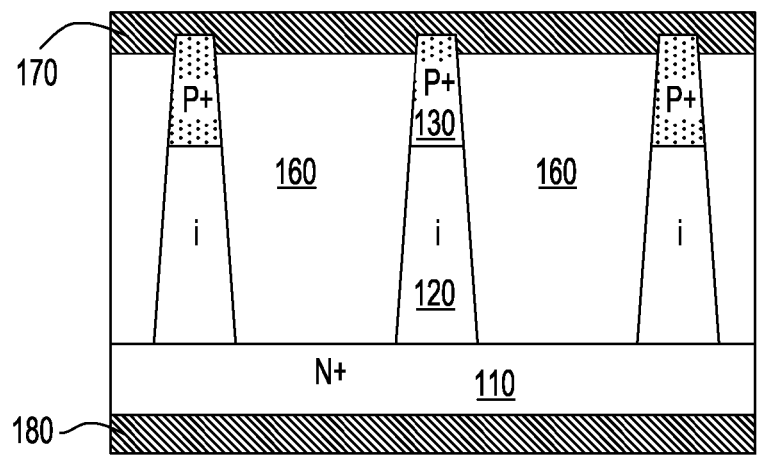

Next, referring to FIG. 3F, the hardmask 140 in FIG. 3E is stripped and contacts 170 and 180 are provided to the P+ and N+ layers. The material for forming the P-contact 170 should be conductive and transparent to the light to be sensed. TiO is one of the materials that can be advantageously used to form the P-contact. N-contact 180 is formed by depositing a conducting material such as metals or metal silicides on the backside of the substrate. Optionally, the substrate can be thinned by polishing, grinding, and/or etching prior to forming the N-contact 180.

Figure 3G:
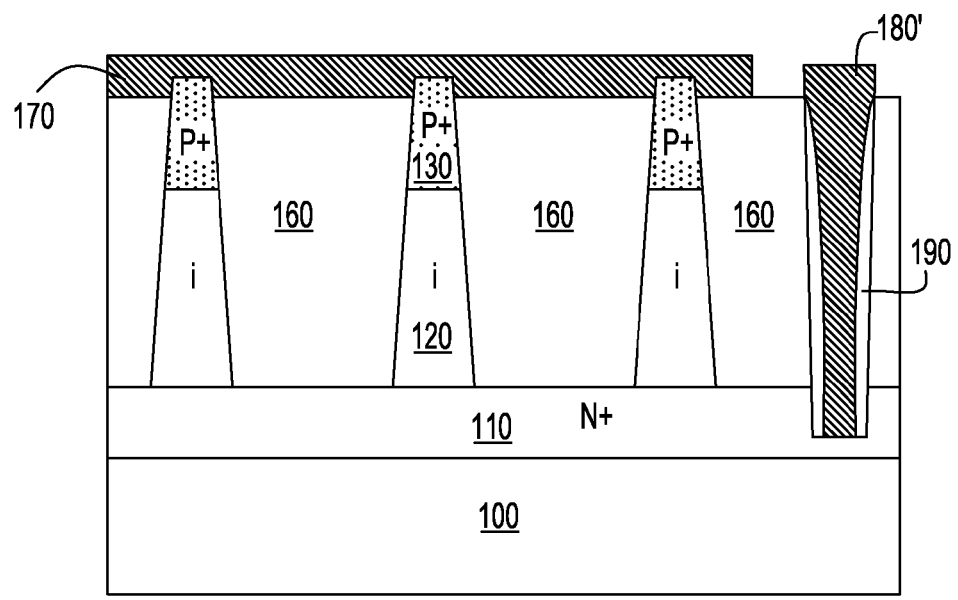

Referring now to FIG. 3G, an alternative embodiment is presented for forming N-contact 180' on the same side of the P-contact 170. In the present embodiment, the N-contact 180' is formed by etching a contact hole through oxide to the N+ layer, forming an insulator spacer 190 (e.g., nitride spacer) on the sidewall of the contact hole, and then filling the contact hole with conducting material. FIG. 3G is a diagram showing how to make contact from the front side to the lower electrode. This construction applies to all the embodiments of the present invention.

The second embodiment of fabricating p-i-n diodes is described in FIG. 4A to FIG. 4G. In contrast to the first embodiment where the P+ pillar regions are formed before the pillars, in the second embodiment, the P+ region in the top portion of the pillars are formed following the construction of the pillars.

Figure 4A:
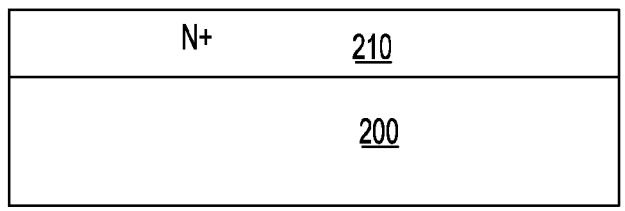
FIGS. 4A-4G show a second set of schematic diagrams illustrating a second embodiment of the invention.

Referring to FIG. 4A, a semiconductor substrate 200 with an N+ layer 210 is provided. The structure is essentially similar to the structure shown in FIG. 3A.

Figure 4B:
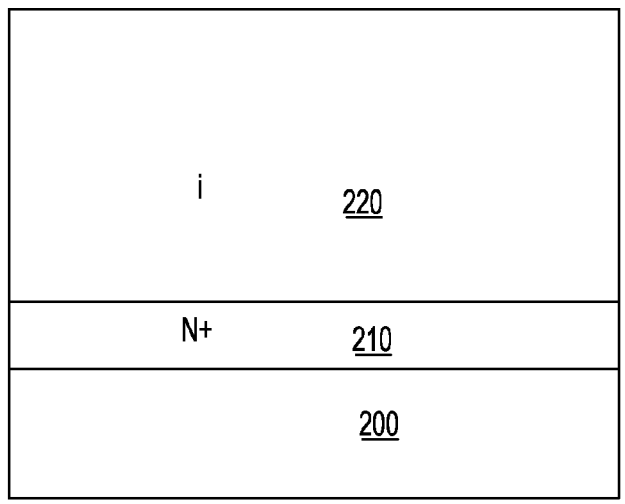

Referring to FIG. 4B, an intrinsic or lightly doped layer (i-layer) 220 is epitaxially grown on the N+ layer 210. Alternatively, the structure in FIG. 4B can be formed by implanting N-type dopants into an intrinsic or lightly doped substrate to form the N+ layer 210.

Figure 4C:
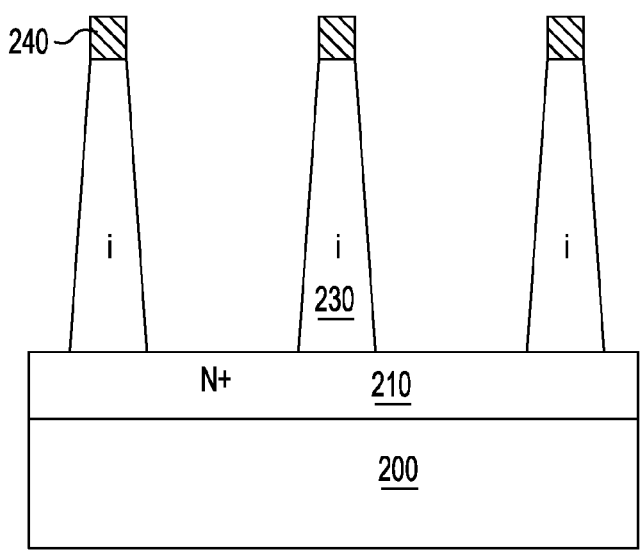

Referring to FIG. 4C, a hardmask layer 240 is deposited and patterned. The pattern is then transferred through the i-layer to form silicon pillars 230.

Figure 4D:
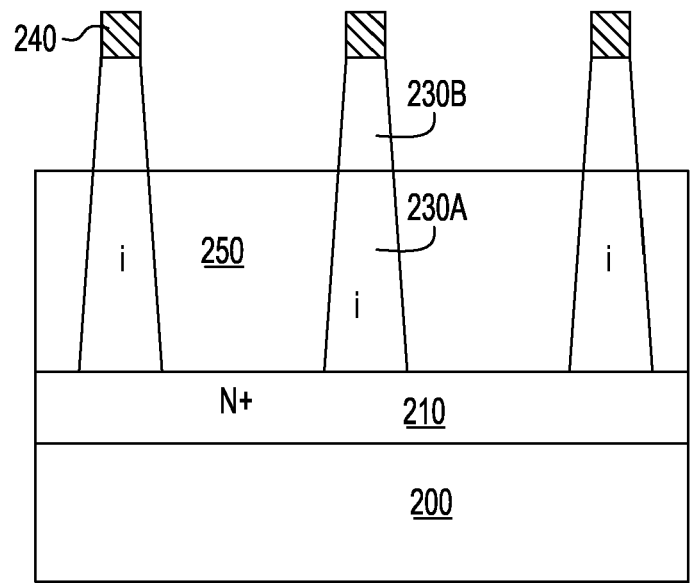

Referring to FIG. 4D, gaps between pillars are filled with an insulating material, such as oxide 250. The oxide is then recessed to expose the upper portion of pillars 230B. The lower portion of pillar 230A is surrounded by oxide 250.

Figure 4E:
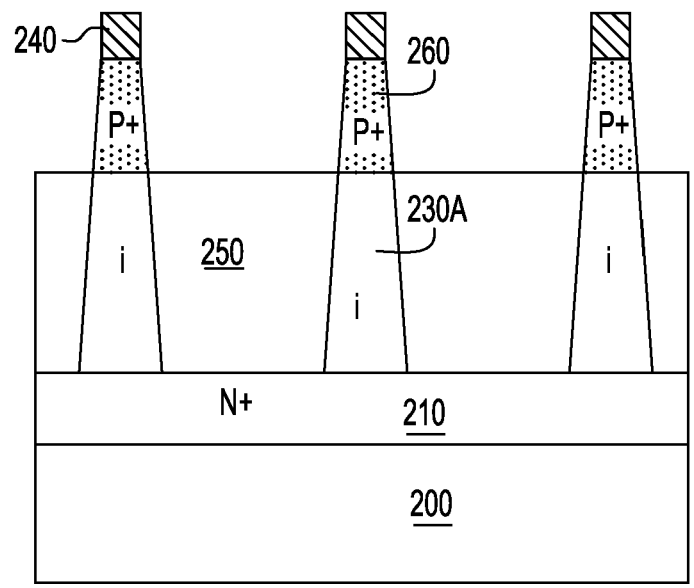

Referring to FIG. 4E, the exposed top pillars 230B in FIG. 4D are doped with a p-type dopant to form P+ regions 260. Processes for forming the P+ regions include, but are not limited to ion implantation, plasma doping, plasma immersion ion implantation, infusion doping, gas phase doping, in-situ doped epitaxial growth, solid phase doping (by depositing a dopant source layer such as arsenic-doped oxide, driving dopants into the substrate by high-temperature anneal, and removing the dopant source layer), and any combination thereof.

Figure 4F:
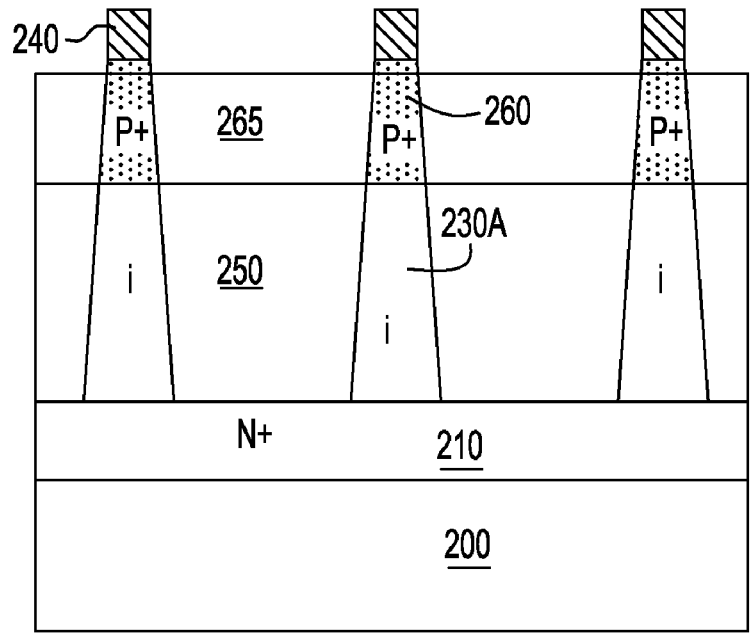

Referring to FIG. 4F, the gaps between pillars 260 are then filled with a second another insulator 255 such as oxide. The oxide is then recessed.

Figure 4G:
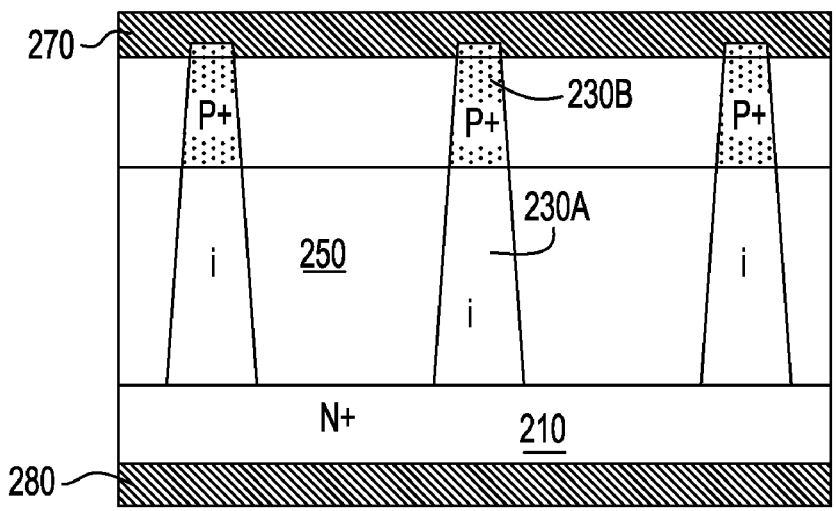

Referring to FIG. 4G, the hardmask 240 is removed and contacts 270 and 280 to the P+ regions 260 and N+ regions 210 are formed to complete p-i-n diode formation, using the same process described in the first embodiment.

The third embodiment of fabricating p-i-n diodes is described in FIG. 5A to FIG. 5H. In this embodiment, the N+ region is formed after forming silicon pillars so that the N+ region is self-aligned to the pillars.

Figure 5A:
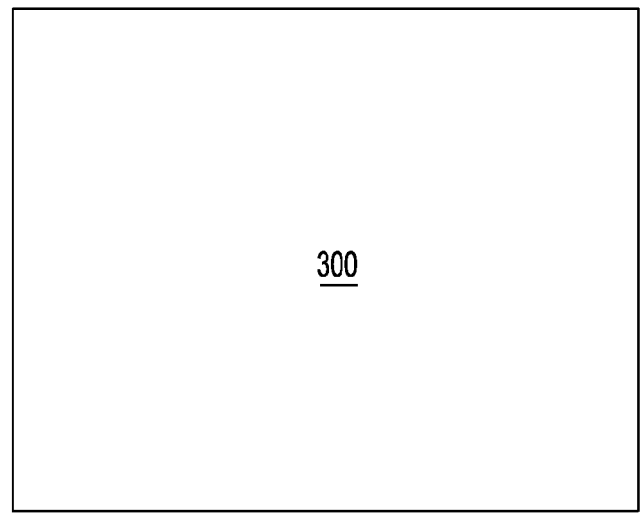
FIGS. 5A-5H show a third set of schematic diagrams illustrating a third embodiment of the invention.
Figure 5B:
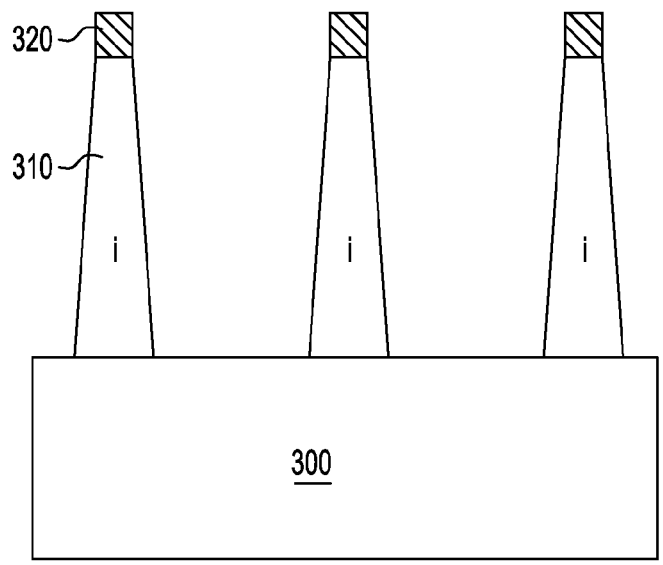

Referring to FIG. 5A, an intrinsic or lightly doped semiconductor substrate such as silicon is provided. Referring to FIG. 5B, silicon pillars 310 are formed by patterning a mask layer 320 and then transferring the patterns in the mask layer 320 into the substrate 300.

Figure 5C:
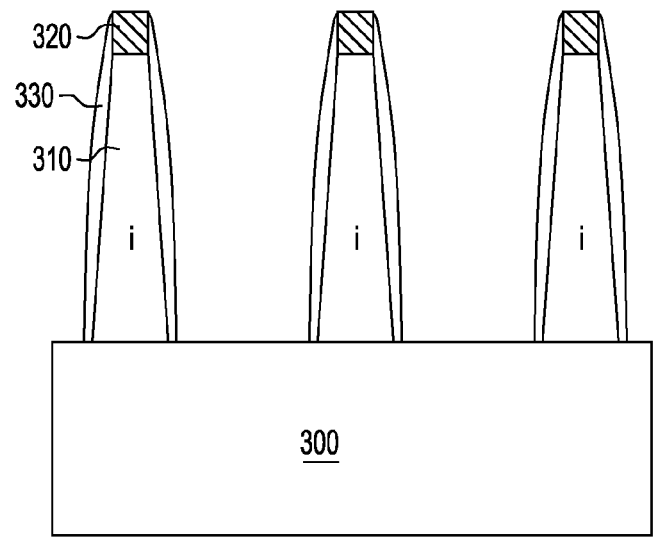

Referring to FIG. 5C, spacers 330 are formed on the pillar sidewalls. Preferably, the spacer is made of silicon nitride. Alternatively, silicon oxide may be advantageously used.

Figure 5D:
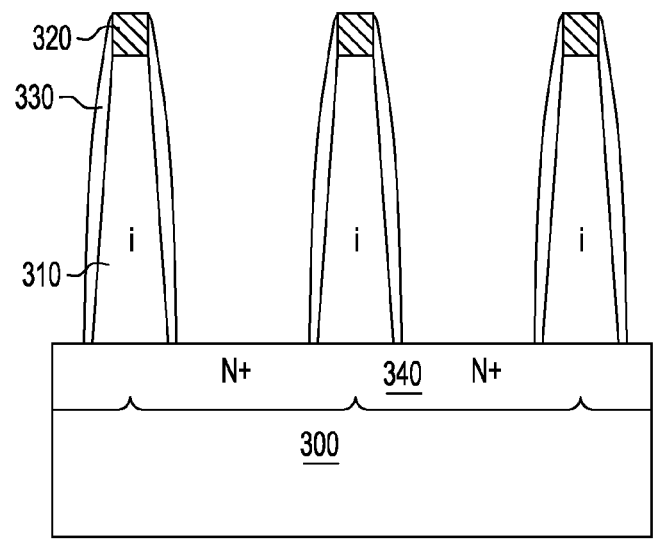

Referring to FIG. 5D, an N+ region 340 self-aligned to pillars 310 is formed in the substrate. Processes for forming the N+ layer include, but are not limited to ion implantation, plasma doping, plasma immersion ion implantation, infusion doping, gas phase doping, in-situ doped epitaxial growth, solid phase doping (by depositing a dopant source layer such as arsenic-doped oxide, driving dopants into the substrate by high-temperature anneal, and removing the dopant source layer), and any combination thereof. The spacer protects the pillars when the N+ region is formed.

Figure 5E:
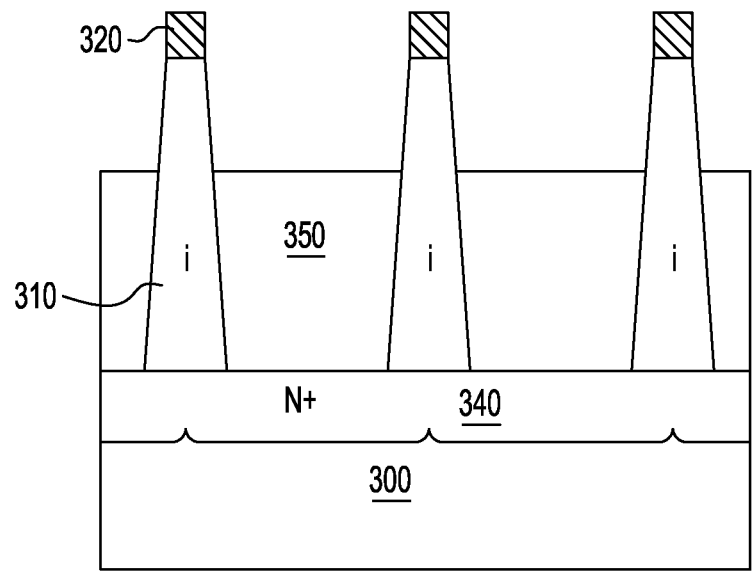

Referring to FIG. 5E, the gaps between pillars 310 are filled with insulator 350, such as oxide. The oxide is then recessed to expose the top portion of pillars. Optionally, the spacer 330 can be removed before filling the gaps.

Figure 5F:
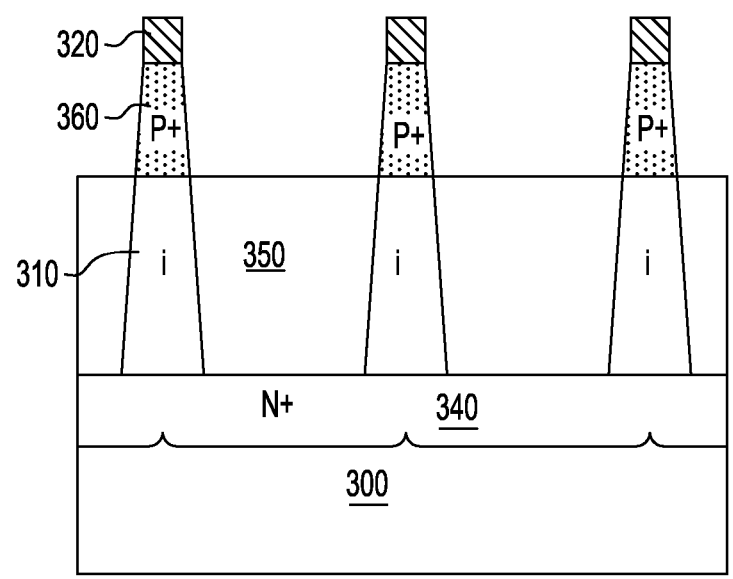

Referring to FIG. 5F, the exposed top pillars are doped with p-type dopant, using the same process described in the second embodiment to form a P+ region 360.

Figure 5G:
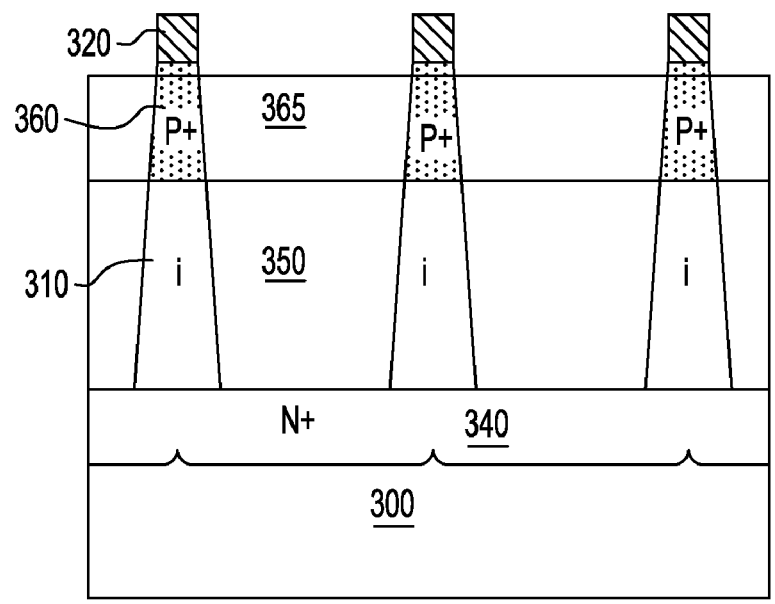

Referring to FIG. 5G, the gaps between pillars are then filled with another insulator 365, such oxide and the oxide is then recessed.

Figure 5H:
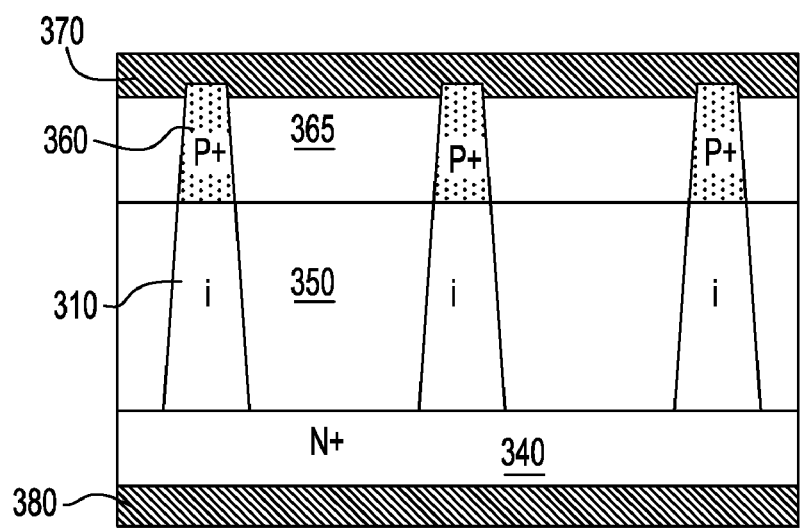

Referring to FIG. 5H, contacts 370 and 380 to the P+ regions 360 and N+ regions 340 are formed to complete the p-i-n diode formation, using the same processes described in previous embodiments.

While the present invention has been particularly described in conjunction with exemplary embodiments, it is evident that many alternatives, modifications and variations will be apparent to those skilled in the art in light of the present description. For instance, one may achieve the same goal by using different kinds of semiconductor materials, different aspect ratios of the pillar shape, the different densities of the pillars, different electrode materials, and the like. It is therefore contemplated that the appended claims will embrace any such alternatives, modifications and variations as falling within the true scope and spirit of the present invention.

What is claimed is:

1. A semiconductor device comprising at least a first and a second pillar p-i-n diodes, said first and second pillar p-i-n diodes having a middle intrinsic region positioned between an n-doped region and a p-doped region, wherein light energy reflected by said first p-i-n diode is absorbed by said second p-i-n diode, said at least first and second pillar p-i-n diodes being replicated and arranged in an array configuration having an area efficiency given by equation:

$$(h/r)\pi/n^2 > 1,$$

wherein h is the pillar height, r is a radius at the bottom of the pillar, and n is a ratio of the pillar center-to-center spacing to the radius r at the bottom of the pillar.

2. The semiconductor device recited in claim 1, wherein said at least first and second pillar p-i-n diodes are immersed in an optically transparent medium.

3. The semiconductor device as recited in claim 1 wherein each of said at least first and second pillar p-i-n diodes comprises a first electrode connected to said p-doped region, and a second electrode connected to said n-doped region.

4. The semiconductor device as recited in claim 1, wherein each of said at least first and second pillar p-i-n diodes have an aspect ratio ranging from 5 to 50.

5. The semiconductor device as recited in claim 4, wherein each of said pillar p-i-n diodes is made of silicon comprising an intrinsic or lightly doped region sandwiched between said p-doped region and n-doped region at respective ends of said pillar p-i-n diodes.

6. The semiconductor device as recited in claim 3 wherein said first electrode is an optically transparent conductor.

7. The semiconductor device as recited in claim 4, wherein said pillars have a tapered profile.

8. The semiconductor device as recited in claim 5, wherein surface areas of said p-i-n diodes are exposed to light.

9. The semiconductor device as recited in claim 1 wherein said p-i-n diode array form a photo-electronic conversion device.

10. The semiconductor device as recited in claim 9, wherein said array is embedded in an optically transparent dielectric layer.

11. The semiconductor device as recited in claim 3, wherein said first electrode is made of titanium oxide (TiO).

12. An arrangement of semiconductor devices formed on a semiconductor substrate, comprising a plurality of p-i-n diodes exposed to light, each comprising a pillar formed by an intrinsic (i) region positioned between a p-doped region and an n-doped region, each of said p-i-n diodes having respectively a surface of the i-region that is greater than an area of contact between said p-doped region and said i-region.

13. The arrangement of p-i-n devices as recited in claim 12 wherein light energy reflected from a first p-i-n diode is absorbed by a second one of said p-i-n diodes.

14. The arrangement of p-i-n devices as recited in claim 12, wherein said respective p-doped regions are transparent.

* * * * *